(12) United States Patent
Ashizawa et al.

(10) Patent No.: US 12,119,219 B2
(45) Date of Patent: Oct. 15, 2024

(54) FILM FORMING METHOD, METHOD FOR MANUFACTURING SEMICONDUCTOR DEVICE, FILM FORMING DEVICE, AND SYSTEM FOR MANUFACTURING SEMICONDUCTOR DEVICE

(71) Applicant: Tokyo Electron Limited, Tokyo (JP)

(72) Inventors: Hiroaki Ashizawa, Nirasaki (JP); Hideo Nakamura, Nirasaki (JP); Yosuke Serizawa, Nirasaki (JP); Yoshikazu Ideno, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 308 days.

(21) Appl. No.: 17/594,029

(22) PCT Filed: Mar. 26, 2020

(86) PCT No.: PCT/JP2020/013597
§ 371 (c)(1),
(2) Date: Sep. 30, 2021

(87) PCT Pub. No.: WO2020/209081
PCT Pub. Date: Oct. 15, 2020

(65) Prior Publication Data
US 2022/0157600 A1    May 19, 2022

(30) Foreign Application Priority Data

Apr. 11, 2019    (JP) .................. 2019-075480

(51) Int. Cl.
*H01L 21/31*    (2006.01)
*C23C 16/34*    (2006.01)
(Continued)

(52) U.S. Cl.
CPC ........ *H01L 21/02186* (2013.01); *C23C 16/34* (2013.01); *C23C 16/345* (2013.01);
(Continued)

(58) Field of Classification Search
CPC ............... H01L 21/0217; C23C 16/345; C23C 16/45525
(Continued)

(56) References Cited

U.S. PATENT DOCUMENTS 6,373,111 B1 * 4/2002 Zheng ............. H01L 27/088
257/E27.06
6,491,978 B1 * 12/2002 Kalyanam ........ H01L 21/76856
257/E21.582

(Continued)

FOREIGN PATENT DOCUMENTS

| CN | 103456614 A | 12/2013 |
|---|---|---|
| JP | 2010-199449 A | 9/2010 |
| JP | 2015-078418 A | 4/2015 |
| JP | 2016-009782 A | 1/2016 |

OTHER PUBLICATIONS

Kirill Isakov et al., Wide-Band "Black Silicon" with Atomic Layer Deposited NbN, Nanotechnology, 2018, vol. 29, 5 pages.

*Primary Examiner* — Nitin Parekh
(74) *Attorney, Agent, or Firm* — Armstrong Teasdale LLP

(57) ABSTRACT

A method of forming a group V metal nitride film on a substrate includes: providing the substrate within a processing container; and forming the group V metal nitride film on the substrate by alternately supplying, into the processing container, a raw material gas including a group V metal and a reducing gas including a nitrogen-containing gas.

6 Claims, 13 Drawing Sheets

(51) Int. Cl.
    *C23C 16/44*      (2006.01)
    *C23C 16/455*     (2006.01)
    *C23C 16/458*     (2006.01)
    *C23C 16/46*      (2006.01)
    *C23C 16/52*      (2006.01)
    *H01L 21/02*      (2006.01)

(52) U.S. Cl.
    CPC .... *C23C 16/4408* (2013.01); *C23C 16/45525* (2013.01); *C23C 16/4584* (2013.01); *C23C 16/46* (2013.01); *C23C 16/52* (2013.01); *H01L 21/0217* (2013.01); *H01L 21/02192* (2013.01); *H01L 21/0228* (2013.01)

(58) Field of Classification Search
    USPC .................................................. 438/685, 785
    See application file for complete search history.

(56) References Cited

U.S. PATENT DOCUMENTS

| | | | |
|---|---|---|---|
| 6,506,676 B2* | 1/2003 | Park | C23C 14/048 |
| | | | 438/653 |
| 6,955,986 B2* | 10/2005 | Li | H01L 21/28562 |
| | | | 438/653 |
| 7,563,715 B2* | 7/2009 | Haukka | C23C 16/45525 |
| | | | 257/E21.462 |
| 2006/0216932 A1* | 9/2006 | Kumar | H01L 21/76831 |
| | | | 257/E21.171 |
| 2007/0036892 A1* | 2/2007 | Haukka | C23C 16/0218 |
| | | | 257/E21.171 |
| 2015/0099374 A1* | 4/2015 | Kakimoto | C23C 16/45542 |
| | | | 118/724 |
| 2018/0212019 A1 | 7/2018 | Adusumilli et al. | |
| 2018/0350588 A1* | 12/2018 | Raisanen | H01L 21/02389 |
| 2020/0243732 A1* | 7/2020 | Naito | C09K 11/02 |

* cited by examiner

FIG. 12

| | Sample F (TiN film 10nm) | Sample G (TiN film 1nm) | Sample H (TiN film 0.3nm) |
|---|---|---|---|
| Rs distribution | | | |
| Cross section SEM | | | |
| Rs ave(Ω/sq) | 104 | 379 | 461 |
| 1σ% | 5.7% | 9.9% | 10.2% |
| SEM film thickness of NbN film | 13.2nm | 13.1nm | 13nm |
| Resistivity (μΩ-cm) | 228μΩ-cm | 498μΩ-cm | *599(690)μΩ-cm |

*average(center)

FIG. 13

| | Sample I (NbF$_5$/purging/NH$_3$/purging) | Sample J (NbF$_5$/purging/NH$_3$/purging/H$_2$/purging) | Sample K (NbF$_5$/purging/NH$_3$/purging/H$_2$/purging) |
|---|---|---|---|
| Oblique visual field | | | |
| Cross section | | | |
| SEM film thickness of NbN film [nm] (3-point average) | 13.17 | 10.13 | 10.37 |
| Resistivity [µΩ·cm] (Center) | 148.1 | 124.2 | 106.3 |

FILM FORMING METHOD, METHOD FOR MANUFACTURING SEMICONDUCTOR DEVICE, FILM FORMING DEVICE, AND SYSTEM FOR MANUFACTURING SEMICONDUCTOR DEVICE

CROSS-REFERENCE TO RELATED APPLICATIONS

This application is a National Stage Application of International Patent Application No. PCT/JP2020/013597, having an International Filing Date of Mar. 26, 2020, which claims the benefit of priority to Japanese Patent Application No. 2019-075480, filed Nov. 4, 2019, each of which is hereby incorporated by reference herein.

TECHNICAL FIELD

The present disclosure relates to a film forming method, a semiconductor device manufacturing method, a film forming apparatus, and a semiconductor device manufacturing system.

BACKGROUND

In a semiconductor device manufacturing process, for example, metal-based films are used for various purposes, such as electrodes (e.g., lower electrodes of DRAMs) and barrier films. In addition, in response to the recent miniaturization of devices, it is required to form metal-based films with high step coverage.

Metal nitride films, such as a TiN film, are used as such metal-based films. For example, Patent Document 1 proposes a technique of forming a TiN film with high step coverage through an atomic layer deposition (ALD) method.

A TaN film is also known as a metal nitride film. For example, Patent Document 2 describes forming a TaN film on an insulating layer having a groove as a barrier metal for Cu wiring through a PVD method.

PRIOR ART DOCUMENTS

Patent Documents

Patent Document 1: Japanese Laid-Open Patent Publication No. 2015-78418
Patent Document 2: Japanese Laid-Open Patent Publication No. 2016-9782

SUMMARY

The present disclosure provides a film forming method, a semiconductor device manufacturing method, a film forming apparatus, and a semiconductor device manufacturing system, which are capable of forming a group V metal nitride film having good film quality with high step coverage.

A method according to an embodiment of the present disclosure relates to a method of forming a group V metal nitride film on a substrate, wherein the method includes: providing the substrate within a processing container; and alternately supplying, into the processing container, a raw material gas including a group V metal and a reducing gas including a nitrogen-containing gas to form a group V metal nitride film on the substrate.

According to the present disclosure, it is possible to form a group V metal nitride film having good film quality with high step coverage.

BRIEF DESCRIPTION OF DRAWINGS

FIG. 12 is a view showing Rs distributions, cross-sectional SEM photographs, Rs values, SEM film thicknesses of NbN films, and resistivities of Samples F to H in Experimental Example 3.
FIG. 13 is a view illustrating SEM photographs of Samples I to K in Experimental Example 4.

DETAILED DESCRIPTION

Hereinafter, embodiments will be described with reference to the accompanying drawings.

Background and Outline

First, the background and outline of the film forming method of the present disclosure will be described.
In semiconductor device manufacturing processes, for example, metal nitride films are used for various purposes such as electrodes (e.g., lower electrodes of DRAMs) and barrier films. Among the metal nitride films, a method of forming a TiN film with high step coverage through an ALD method has been almost established.
As metal nitride films applied to the semiconductor device manufacturing processes, nitride films of group V metals, such as tantalum (Ta) and niobium (Nb), have also been examined and partially used. However, no method has been found for forming a film with high step coverage.

As a result of examination by the inventors, it has been found that it is possible to form a group V metal nitride film with good step coverage through an ALD method in which a cycle of alternately supplying a raw material gas including a group V metal and a reducing gas including a nitrogen-containing gas is repeated a desired number of times.

<Film Forming Method>

Next, an embodiment of a film forming method will be described.

Figure 1:
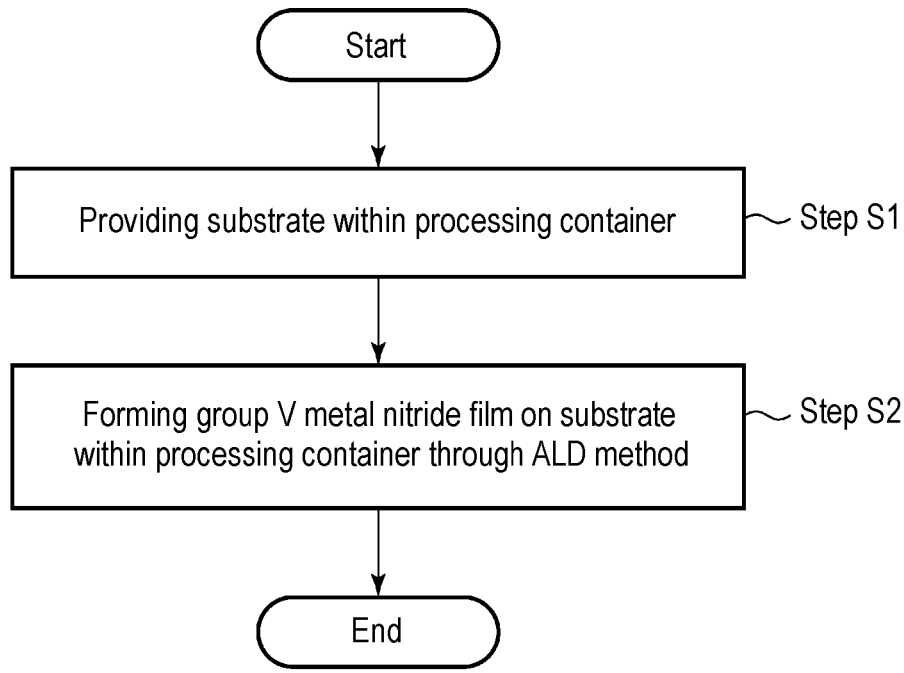
FIG. 1 is a flowchart illustrating a film forming method according to an embodiment.

FIG. 1 is a flowchart illustrating a film forming method according to an embodiment. As illustrated in FIG. 1, the film forming method according to this embodiment includes a step of providing a substrate within a processing container (step S1) and a step of forming a group V metal nitride film on the substrate in the processing container through an ALD method (step S2).

In step S1, a substrate on which a group V metal nitride film is to be formed is disposed in the processing container of a film forming apparatus to prepare for film formation. The substrate is not particularly limited, and a semiconductor substrate (a semiconductor wafer) having a semiconductor base body, such as silicon, is exemplified.

Preferably, a metal-based film or a nitride film as a seed layer or a nucleation layer is formed on the surface of the substrate (a group V metal nitride film-forming surface). As the metal-based film, a metal film or a metal nitride film may be used, and examples thereof include a titanium-containing film. As the titanium-containing film, a titanium nitride (TiN) film is suitable. The TiN film is also a nitride film. A titanium-containing film, especially a TiN film, has a great effect of promoting nucleation of a group V metal nitride film. The TiN film may be a film formed through an ALD method. The TiN film formed through the ALD method may be formed by alternately supplying $TiCl_4$ gas used as a Ti-containing gas and $NH_3$ gas used as a nitrogen-containing gas. Examples of the nitride film include a silicon nitride (SiN), TiSiN, and the like.

In step S2, a raw material gas including a group V metal and a reducing gas including a nitrogen-containing gas are alternately supplied to the substrate in the processing container to form a group V metal nitride film.

Group V metals include vanadium (V), niobium (Nb), and tantalum (Ta). By supplying the raw material gas including the group V metal, the raw material gas having almost one molecular layer is adsorbed on the substrate. Next, by supplying the reducing gas including the nitrogen-containing gas, the adsorbed raw material gas is nitrided, and a unit nitride film having a substantially one molecular layer is formed. By performing these operations a predetermined number of times, a group V metal nitride film having a desired film thickness is formed. Examples of the group V metal nitride film include a vanadium nitride (VN), a niobium nitride (NbN), and a tantalum nitride (TaN).

As the raw material gas including a group V metal, an inorganic or organic compound including the group V metal, such as V, Nb, or Ta, may be used. For example, a niobium fluoride gas (e.g., $NbF_5$ gas) may be used as the raw material gas including Nb.

After supplying the raw material gas including the group V metal and after supplying the reducing gas, it is preferable to purge the residual gas in the processing container. As the purge gas, an inert gas may be used. As the inert gas, a rare gas, such as $N_2$ gas or Ar gas, may be preferably used. The purge gas may be constantly supplied while the film forming process is being performed.

Examples of the nitrogen-containing gas included in the reducing gas include $NH_3$ gas and a hydrazine-based compound gas. The hydrazine-based compound is a compound having a N—N bond and a H or monovalent hydrocarbon group bonded to a bonding hand of N, and examples thereof include hydrazine, monomethylhydrazine, dimethylhydrazine, and tertiarybutylhydrazine.

A nitrogen-containing gas alone may be used as a reducing gas, and as a gas supply sequence in that case, exemplified is the following sequence: repeating, a predetermined number of times, supply of raw material gas containing group V metal→purging of residual gas→supply of nitrogen-containing gas→purging of residual gas.

As the reducing gas, another reducing gas may be included in addition to the nitrogen-containing gas. As another reducing gas, for example, hydrogen ($H_2$) gas may be used. By supplying another reducing gas, particularly $H_2$ gas, the reduction of the raw material gas including the group V metal further progresses so that the film quality of the formed nitride film can be improved, for example, the resistance of the nitride film can be lowered.

The other reducing gas, such as $H_2$ gas, may be supplied every time the nitrogen-containing gas is supplied, or may be supplied at a part of the timing of supplying the nitrogen-containing gas, for example, once every several times. The nitrogen-containing gas and the other reducing gas may be supplied separately. That is, the reducing gases may be supplied twice for one supply of the raw material gas. In this case, either the nitrogen-containing gas or the other reducing gas, such as $H_2$ gas, may be supplied first. Preferably, the interior of the processing container is purged both after supplying the nitrogen-containing gas and after supplying the other reducing gas. As the gas supply sequence at this time, exemplified are the following:

[1] repeating, a predetermined number of times, supply of raw material gas including group V metal→purging of residual gas→supply of nitrogen-containing gas→purging of residual gas→supply of $H_2$ gas→purging of residual, and

[2] repeating, a predetermined number of times, supply of raw material gas including group V metal→purging of residual gas→supply of $H_2$ gas→purging of residual gas→supply of nitrogen-containing gas→purging of residual gas.

From the viewpoint of further nitriding the raw material gas containing the group V metal, it is preferable to supply the nitrogen-containing gas before the other reducing gases, such as $H_2$ gas.

In addition, the other reducing gas, such as $H_2$ gas, may be constantly supplied while the film forming process is being performed, or may be supplied by a post-flow separately from the reducing gas, which is supplied alternately with the raw material gas including the group V metal. The post-flow may be performed only at the end of the film forming process, or may be performed every one or several cycles of the ALD.

During the film formation, the substrate temperature may be in the range of 200 to 700 degrees C., and the pressure in the processing container may be in the range of 40 to 13,332 Pa (0.3 to 100 Torr).

According to this embodiment, it is possible to form a group V metal nitride film having good film quality on a substrate with high step coverage through an ALD method in which a raw material gas including a group V metal and a reducing gas including a nitrogen-containing gas are alternately supplied.

<Semiconductor Device Manufacturing Method>

Next, an embodiment of a semiconductor device manufacturing method when the above-mentioned group V metal nitride film is applied to a semiconductor device will be described.

Figure 2:
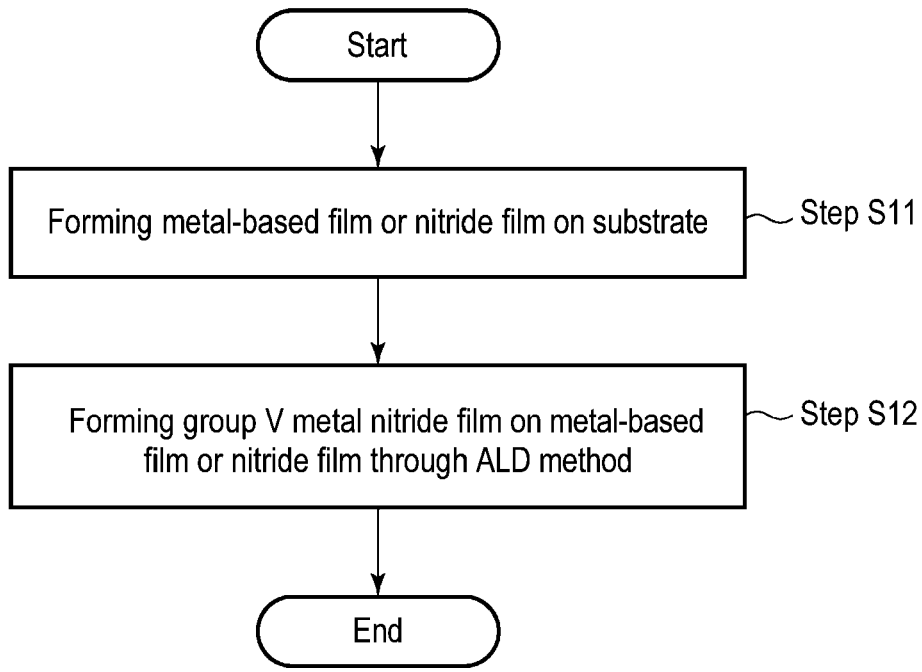
FIG. 2 is a flowchart illustrating a semiconductor device manufacturing method according to an embodiment.
Figure 3A:
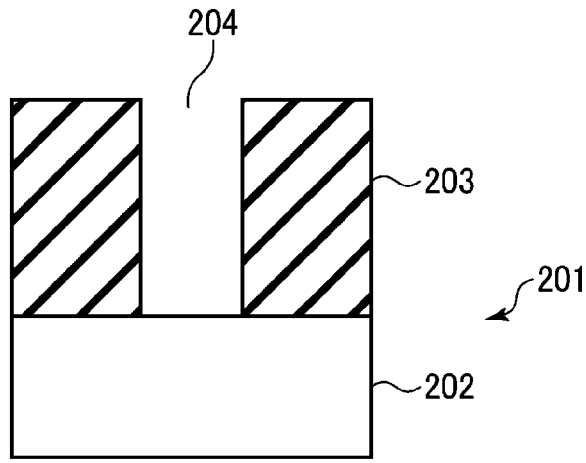
FIG. 3A is a process cross-sectional view for describing the semiconductor device manufacturing method according to an embodiment.
Figure 3B:
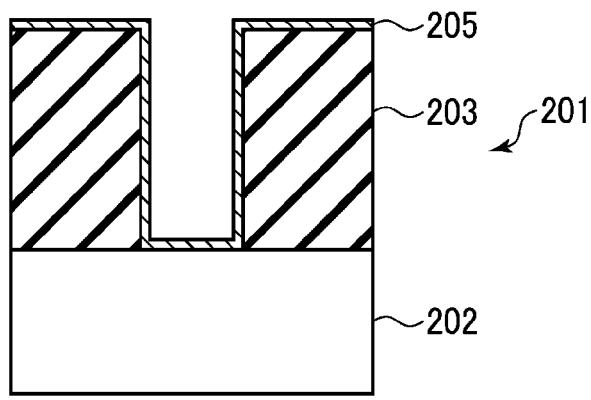
FIG. 3B is a process cross-sectional view for describing the semiconductor device manufacturing method according to an embodiment.
Figure 3C:
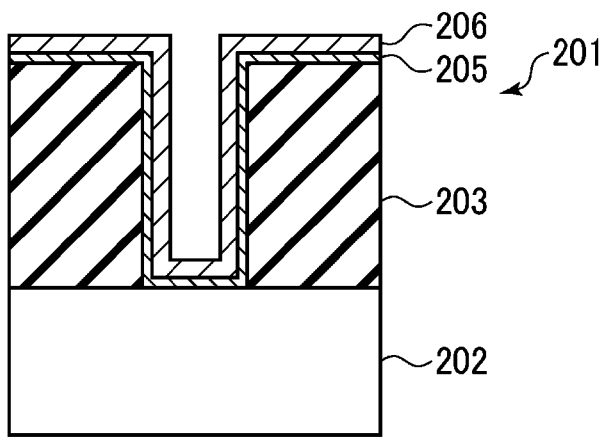
FIG. 3C is a process cross-sectional view for describing the semiconductor device manufacturing method according to an embodiment.

FIG. 2 is a flowchart illustrating the semiconductor device manufacturing method according to an embodiment, and FIGS. 3A to 3C are process cross-sectional views.

As illustrated in FIG. 2, the semiconductor device manufacturing method according to this embodiment includes a step of forming a metal-based film or a nitride film on a substrate (step S11) and a method of forming a group V metal nitride film on the metal-based film or the nitrided film through a ALD method (step S12).

As illustrated in FIG. 3A, an example of the substrate includes a semiconductor wafer 201 in which a $SiO_2$ film 203 is formed on a base body 202 made of, for example, silicon, and a recess 204, such as a hole or a trench, is formed in the $SiO_2$ film 203.

In step S11, for example, a metal-based film 205 is formed on the semiconductor wafer 201, as illustrated in FIG. 3B. The metal-based film 205 serves as a seed layer or a nucleation layer of a group V metal nitride film formed thereon. As the metal-based film 205, a metal film or a metal nitride film may be used, and examples thereof include a titanium-containing film. As the titanium-containing film, a TiN film is suitable. As the TiN film, a film formed through an ALD method may be used. By using the TiN film formed through the ALD method, it is possible to form the TiN film with respect to the fine recess 204 with high step coverage, and in the next step S12, it is possible to form a group V metal nitride film having good surface morphology and film quality on the TiN film. Examples of the method for forming the TiN film through the ALD method include a method forming a film by alternately supplying $TiCl_4$ gas used as a Ti-containing gas and $NH_3$ gas used as a nitrogen-containing gas. The metal-based film 205 may have a thin film thickness and may be 10 nm or less. The metal-based film 205 is able to exhibit the function thereof if it can be formed as a film, and the film thickness thereof may be about 0.3 nm or more. The same effect may also be obtained by using a nitride film, for example, a SiN film instead of the metal-based film 205. The SiN film may be formed through an ALD method using a Si-containing raw material gas (e.g., $SiH_4$ or $Si_2H_6$) and a nitrogen-containing gas (e.g., $NH_3$). A TiSiN film may also be used as the nitride film. The nitride film may also have a thin film thickness and may be 10 nm or less. The nitride film is also able to exhibit the function thereof if it can be formed as a film, and the thickness thereof may be about 0.3 nm or more.

In step S12, as illustrated in FIG. 3C, a group V metal nitride film 206 is formed on the metal film 205 (or the nitride film). As described above, the group V metal nitride film 206 can be formed through an ALD method in which a raw material gas including a group V metal and a reducing gas including a nitrogen-containing gas are alternately supplied.

In this way, after forming the metal-based film 205 on the wafer W, by forming the group V metal nitride film 206 on the metal-based film 205 through an ALD method, it is possible to form a film having good film quality with high step coverage. For example, since a nitride film having a low specific resistance is obtained, the nitride film is suitable as an electrode applied to a DRAM capacitor or the like.

<Specific Example of Film Forming Method>

Next, a specific example of forming a NbN film on a semiconductor wafer (hereinafter, simply referred to as a "wafer") as a substrate through an ALD method using $NbF_5$ gas as a raw material gas including a group V metal and using $NH_3$ gas or $NH_3$ gas and $H_2$ gas as a reducing gas will be described.

[Film Forming Apparatus]

Figure 4:
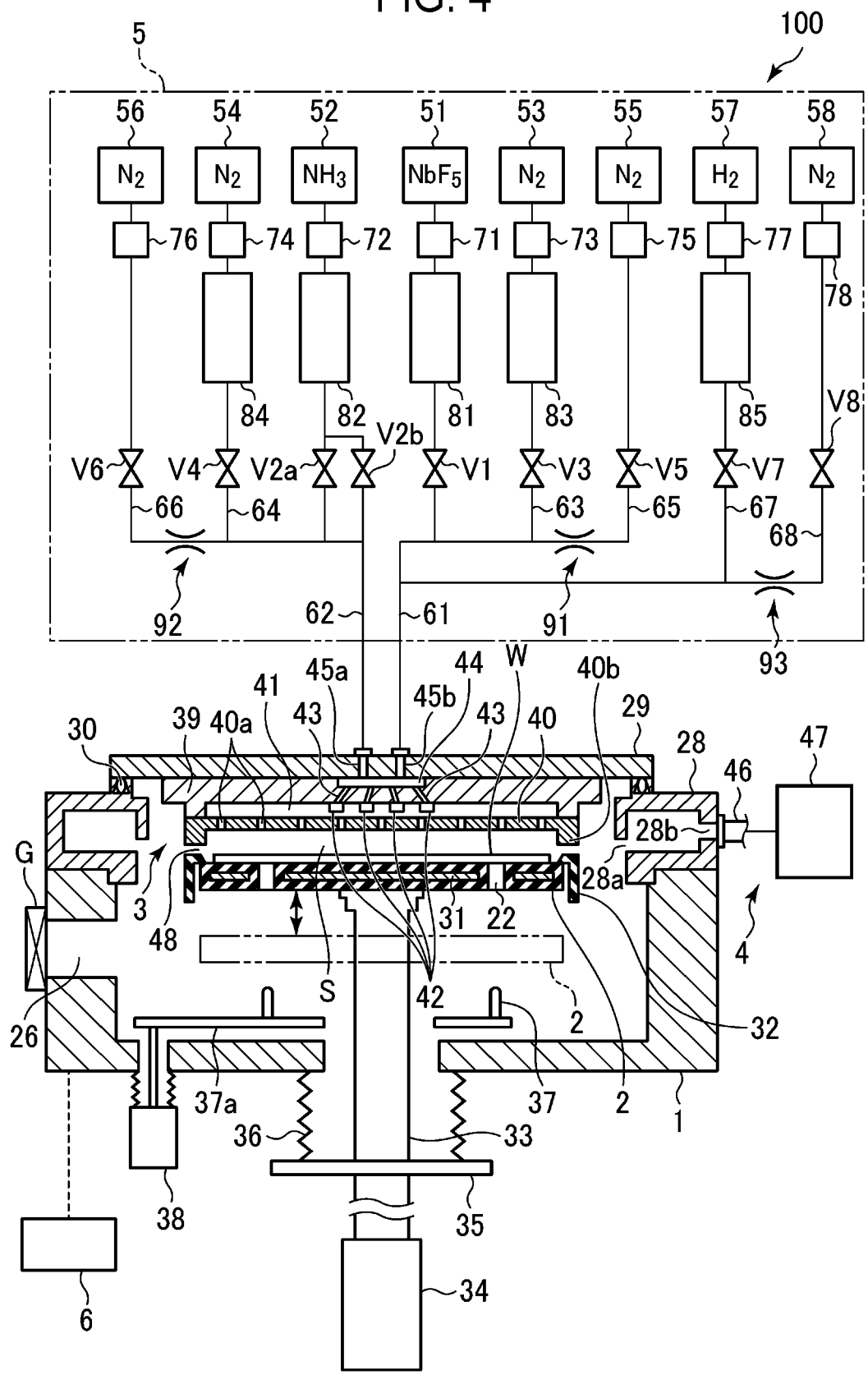
FIG. 4 is a cross-sectional view illustrating an example of a film forming apparatus used in a specific example of the film forming method.

FIG. 4 is a cross-sectional view illustrating an example of a film forming apparatus used in the specific example of the film forming method.

The film forming apparatus 100 includes a chamber 1, a susceptor (a stage) 2, a shower head 3, an exhauster 4, a gas supply mechanism 5, and a controller 6.

The chamber 1 serving as a processing container is a substantially cylindrical container and is made of a metal. A loading/unloading port 26 for loading/unloading a wafer W into/from a vacuum transfer chamber (not illustrated) therethrough by a transfer mechanism (not illustrated) is formed in the side wall of the chamber 1, and the loading/unloading port 26 is configured to be opened/closed by a gate valve G.

An annular exhaust duct 28 having a rectangular cross section is installed on the main body of the chamber 1. The exhaust duct 28 has a slit 28a formed along the inner peripheral surface thereof. In addition, an exhaust port 28b is formed in the outer wall of the exhaust duct 28. On the top surface of the exhaust duct 28, a ceiling wall 29 is installed to close the upper opening of the chamber 1. The space between the ceiling wall 29 and the exhaust duct 28 is hermetically sealed with a seal ring 30.

The susceptor 2 is configured to place thereon a wafer W, which is a substrate, inside the chamber 1, has a disk shape having a size corresponding to the wafer W, and is horizontally installed. The susceptor 2 is supported on a support member 33. A heater 31 configured to heat the wafer W is embedded in the susceptor 2. The heater 31 is supplied with power from a heater power supply (not illustrated) to generate heat. Then, by controlling the output of the heater 31, the wafer W is controlled to a predetermined temperature. The susceptor 2 is installed with a ceramic cover member 32 to cover the outer peripheral region and the side surface of the wafer placement surface.

The support member 33, which supports the susceptor 2, extends from the center of the bottom surface of the susceptor 2 to the lower side of the chamber 1 while penetrating through a hole formed in the bottom wall of the chamber 1, and the lower end of the support member 33 is connected to a lifting mechanism 34. The susceptor 2 is configured to be raised and lowered between a processing position illustrated in FIG. 4 and a transfer position indicated by an alternate long and two short dashes line via the lifting mechanism 34 through the support member 33, wherein wafer transfer is enabled at the transfer position. In addition, a flange 35 is installed on the support member 33 below the chamber 1, and a bellows 36, which partitions the atmosphere within the chamber 1 from the ambient air, is installed between the bottom surface of the chamber 1 and the flange 35 to expand and contract according to the raised and lowered movement of the susceptor 2.

Three wafer support pins 37 (of which only two are illustrated) are installed in the vicinity of the bottom surface of the chamber 1 to protrude upward from a lifting plate 37a. The wafer support pins 37 are configured to be raised and lowered via the lifting plate 37a by the lifting mechanism 38 provided below the chamber 1, and are inserted through through-holes 22 provided in the susceptor 2 located at the transfer position to be movable upward or downward with respect to the top surface of the susceptor 2. Thereby, the wafer W is delivered between the wafer transfer mechanism (not illustrated) and the susceptor 2.

The shower head 3 is configured to supply a processing gas into the chamber 1 in the form of a shower, and is provided in the upper portion of the chamber 1 to face the susceptor 2 and has substantially the same diameter as the susceptor 2. The shower head 3 includes a main body 39 fixed to the ceiling wall 29 of the chamber 1 and a shower plate 40 connected to the lower side of the main body 39. A gas diffusion space 41 is formed between the main body 39 and the shower plate 40.

In the gas diffusion space 41, gas diffusion members 42 are provided. Gas discharge holes are formed around the gas diffusion members 42. The gas diffusion members 42 are connected to one ends of gas supply paths 43, respectively, which are provided in the main body 39. The other ends of the gas supply paths 43 are connected to a diffusion part 44 formed in the central portion of the top surface of the main body 39. In addition, in the central portion of the main body 39, two gas inlet holes 45a and 45b penetrating the main body 39 from the top surface of the main body 39 to the diffusion portion 44 are provided.

An annular protrusion 40b protruding downward is formed at the peripheral edge of the shower plate 40, and gas ejection holes 40a are formed in the flat surface inside the annular protrusion 40b of the shower plate 40. In the state in which the susceptor 2 is located at the processing position, a processing space S is formed between the shower plate 40 and the susceptor 2, and the annular protrusion 40b and the top surface of the cover member 32 of the susceptor 2 are located close to each other to form an annular gap 48 therebetween.

The exhauster 4 includes an exhaust pipe 46 connected to the exhaust port 28b in the exhaust duct 28, and an exhaust mechanism 47 connected to the exhaust pipe 46 and including a vacuum pump, a pressure control valve, or the like. During processing, the gas within the chamber 1 reaches the exhaust duct 28 through the slit 28a, and is exhausted from the exhaust duct 28 through the exhaust pipe 46 by the exhaust mechanism 47 of the exhauster 4.

The gas supply mechanism 5 has a $NbF_5$ gas line 61 and an $NH_3$ gas line 62, one ends of which are connected to the above-described gas inlet holes 45b and 45a, respectively. $NbF_5$ gas as a raw material gas of Nb is supplied to the $NbF_5$ gas line 61, and $NH_3$ gas as a nitrogen-containing gas, which functions as a reducing gas, is supplied to the $NH_3$ gas line 62.

In the $NbF_5$ gas line 61, a valve V1, a gas storage tank 81, and a flow rate adjuster 71 are installed in this order from the lower side, and a $NbF_5$ gas source 51 configured to supply the $NbF_5$ gas as the raw material gas of Nb is connected to the other end of the $NbF_5$ gas line 61. The $NbF_5$ gas is a substance, which is in a solid state at room temperature and has a melting point of 80 degrees C., and the $NbF_5$ gas source 51 includes a film-forming raw material tank containing $NbF_5$ and a heater provided around the film-forming raw material tank. The $NbF_5$ in the raw material tank is heated to, for example, 50 to 200 degrees C. by the heater to sublimate the $NbF_5$.

One end of the first purge gas line 63 is connected to the downstream side of the valve V1 in the $NbF_5$ gas line 61. A valve V3, a gas storage tank 83, and a flow rate adjuster 73 are installed in the first purge gas line 63 in this order from the lower side, and a first purge gas source 53 configured to supply $N_2$ gas for purging is connected to the other end of the first purge gas line 63.

In addition, one end of a first carrier gas line 65 configured to supply $N_2$ gas as a carrier gas of the $NbF_5$ gas is connected to the downstream side of the valve V3 in the first purge gas line 63. A valve V5 and a flow rate adjuster 75 are installed in the first carrier gas line 65 in this order from the lower side, and a first carrier gas source 55 as a supply source of the $N_2$ gas as the carrier gas of the $NbF_5$ gas is connected to the other end of the first carrier gas line 65. An orifice 91 is formed on the downstream side of the valve V5 in the first carrier gas line 65. The diameter on the downstream side of the valve V5 in the first carrier gas line 65 is smaller than the diameter on the upstream side of the valve V5 in the first carrier gas line 65 and the diameters of the gas lines 61 and 63. Therefore, from the gas storage tanks 81 and 83, gases are supplied to the gas lines 61 and 63 at relatively large flow rates, respectively, and the gases supplied to the gas lines 61 and 63 are suppressed from flowing back though the gas line 65 by the orifice 91.

The carrier gas from the first carrier gas source 55 is continuously supplied into the processing container 11 during the processing of the wafer W, and functions as a purge gas when purging. The carrier gas also functions as a backflow prevention gas for preventing the $NbF_5$ gas from flowing back through the first carrier gas line 65.

The $NH_3$ gas line 62 has a configuration in which the $NH_3$ gas line 62 branches into two lines on the upstream side thereof and then the branch lines merge. In the $NH_3$ gas line 62 after merging, a gas storage tank 82 and a flow rate adjuster 72 are installed in this order from the lower side, and an $NH_3$ gas source 52 is connected to the end of the $NH_3$ gas line 62 after merging. Thus, $NH_3$ gas is supplied into the chamber 1 from the $NH_3$ gas source 52. Valves V2a and V2b are provided in the two branch lines, respectively. By forming the branching flow paths on the downstream side of the gas storage tank 82 in this way, the conductance is increased so that a large flow rate of $NH_3$ gas can be supplied to the chamber 1.

One end of the second purge gas line 64 is connected to the downstream side of the valve V2a in the portion branching from the $NH_3$ gas line 62. A valve V4, a gas storage tank 84, and a flow rate adjuster 74 are installed in the second purge gas line 64 in this order from the lower side, and a second purge gas source 54 configured to supply $N_2$ gas for purging is connected to the other end of the second purge gas line 64.

In addition, one end of a second carrier gas line 66 configured to supply $N_2$ gas as a carrier gas of the $NH_3$ gas is connected to the downstream side of the valve V4 in the second purge gas line 64. A valve V6 and a flow rate adjuster 76 are installed in the second carrier gas line 66 in this order from the lower side, and a second carrier gas source 56 as a supply source of the $N_2$ gas as the carrier gas of the $NH_3$ gas is connected to the other end of the second carrier gas line 66. An orifice 92 is formed on the downstream side of the valve V6 in the second carrier gas line 66. The diameter on the downstream side of the valve V6 in the second carrier gas line 66 is smaller than the diameter on the upstream side of the valve V6 in the second carrier gas line 66 and the diameters of the gas lines 62 and 64. Therefore, from the gas storage tanks 82 and 84, gases are supplied to the gas lines 62 and 64 at relatively large flow rates, respectively, and the gases supplied to the gas lines 62 and 64 are suppressed from flowing back though the gas line 66 by the orifice 92.

The carrier gas from the second carrier gas source 56 is continuously supplied into the chamber 1 during the processing of the wafer W, and functions as a purge gas when purging. The carrier gas also functions as a backflow prevention gas for preventing the $NH_3$ gas from flowing back through the second carrier gas line 66.

One end of a $H_2$ gas line 67 configured to supply $H_2$ gas functioning as a reducing gas is connected to the downstream side of the connection portion of the first purge gas line 63 in the $NbF_5$ gas line 61. A valve V7, a gas storage tank 85, and a flow rate adjuster 77 are installed in the $H_2$ gas line 67 in this order from the lower side, and a $H_2$ gas source 57 configured to supply the $H_2$ gas is connected to the other end of the $H_2$ gas line 67.

One end of a third carrier gas line 68 configured to supply $N_2$ gas as a carrier gas of the $H_2$ gas is connected to the downstream side of the valve V7 in the $H_2$ gas line 67. A valve V8 and a flow rate adjuster 78 are installed in the third carrier gas line 68 in this order from the lower side, and a third carrier gas source 58 as a supply source of the $N_2$ gas as the carrier gas of the $H_2$ gas is connected to the other end of the third carrier gas line 68. A backflow prevention orifice 93 is formed on the downstream side of the valve V8 in the third carrier gas line 68. The carrier gas also functions as a backflow prevention gas for preventing the $H_2$ gas from flowing back through the third carrier gas line 68.

In addition, the $H_2$ gas line and the $H_2$ gas source may be connected to the $NH_3$ gas line 62, or may be connected to both the $NbF_5$ gas line 61 side and the $NH_3$ gas line 62, together with the carrier gas line and the carrier gas source.

Each of the flow rate adjusters 71, 72, 73, 74, 75, 76, 77, and 78 may be constituted with, for example, a mass flow controller, and adjust and control the flow rates of gases flowing through respective corresponding gas lines.

The gas storage tanks 81, 82, 83, 84, and 85 temporarily store the gases supplied from the gas sources connected to respective corresponding gas lines before supplying the gases into the chamber 1. After the pressure inside each storage tank is increased to a predetermined pressure by storing the gases, respective gases are supplied to the chamber 1 from respective gas storage tanks. As a result, it is possible to stably supply a large flow rate of gases to the processing container. The supply/the stop of supply of respective gases from these gas storage tanks 81, 82, 83, 84, and 85 to the chamber 1 are performed through opening/closing of the corresponding valves. The valves V1, V2a, V2b, V3, V4 and V7 are constituted with high-speed valves that can be opened/closed at high speed.

When purging the chamber 1, $N_2$ gas may be supplied as a purge gas from the first purge gas line 63 and the second purge gas line 64 to strengthen the purge, but the supply of the $N_2$ gas from the first and second purge gas lines 63 and 64 is not essential. In addition, the gas storage tanks 81, 82, 83, 84, and 85 may not be used.

The controller 6 is constituted with a computer, and has a main controller including a CPU, an input device (e.g., a keyboard or a mouse), an output device (e.g., a printer), a display device (e.g., a display), and a storage device (a storage medium). The main controller controls the operations of respective components, such as opening/closing of the opening/closing valves V1 to V8, adjustment of gas flow rates through the flow rate controllers 71 to 78, adjustment of the pressure in the chamber 1 by a pressure control valve, and adjustment of the temperature of a wafer W by the heater 31. The control of these operations is executed by a processing recipe which is a control program stored in a storage medium (e.g., a hard disk, an optical desk, or a semiconductor memory) embedded in the storage device.

[Film Forming Method]

Next, a method of forming a NbN film in the film forming apparatus 100 configured as described above will be described.

First, the gate valve G is opened, and a wafer W is loaded into the chamber 1 from a vacuum transfer chamber by a transfer apparatus and placed on the susceptor 2. After retracting the transfer apparatus, the gate valve G is closed and the susceptor 2 is raised to the processing position. Next, from the first carrier gas source 55, the second carrier gas source 56, and the third carrier gas source 58, $N_2$ gas is continuously supplied into the processing space S via the first carrier gas line 65, the second carrier gas line 66, and the third carrier gas line 68. As a result, the interior of the chamber 1 is maintained in a predetermined depressurized state, and the temperature of the susceptor 2 is controlled to a predetermined temperature by the heater 31.

Then, a NbN film is formed by operating the valves V1, V2a, V2b, and V7 in the $NbF_5$ gas line 61, the $NH_3$ gas line 62, and the $H_2$ gas line 67 while maintaining the state in which the $N_2$ gas is continuously supplied. The film formation at this time is performed through an ALD method in which $NbF_5$ gas and a reducing gas are alternately supplied. As the reducing gas, $NH_3$ gas alone may be used or $NH_3$ gas and $H_2$ gas may be used. In addition, the flow rate of the $N_2$ gas during purging may be increased by operating the valves V3 and V4 in the first purge gas line 63 and the second purge gas line 64. The film forming process at this time may be implemented through, for example, the following gas supply sequences of Cases A to C.

1. Case A

Figure 5:
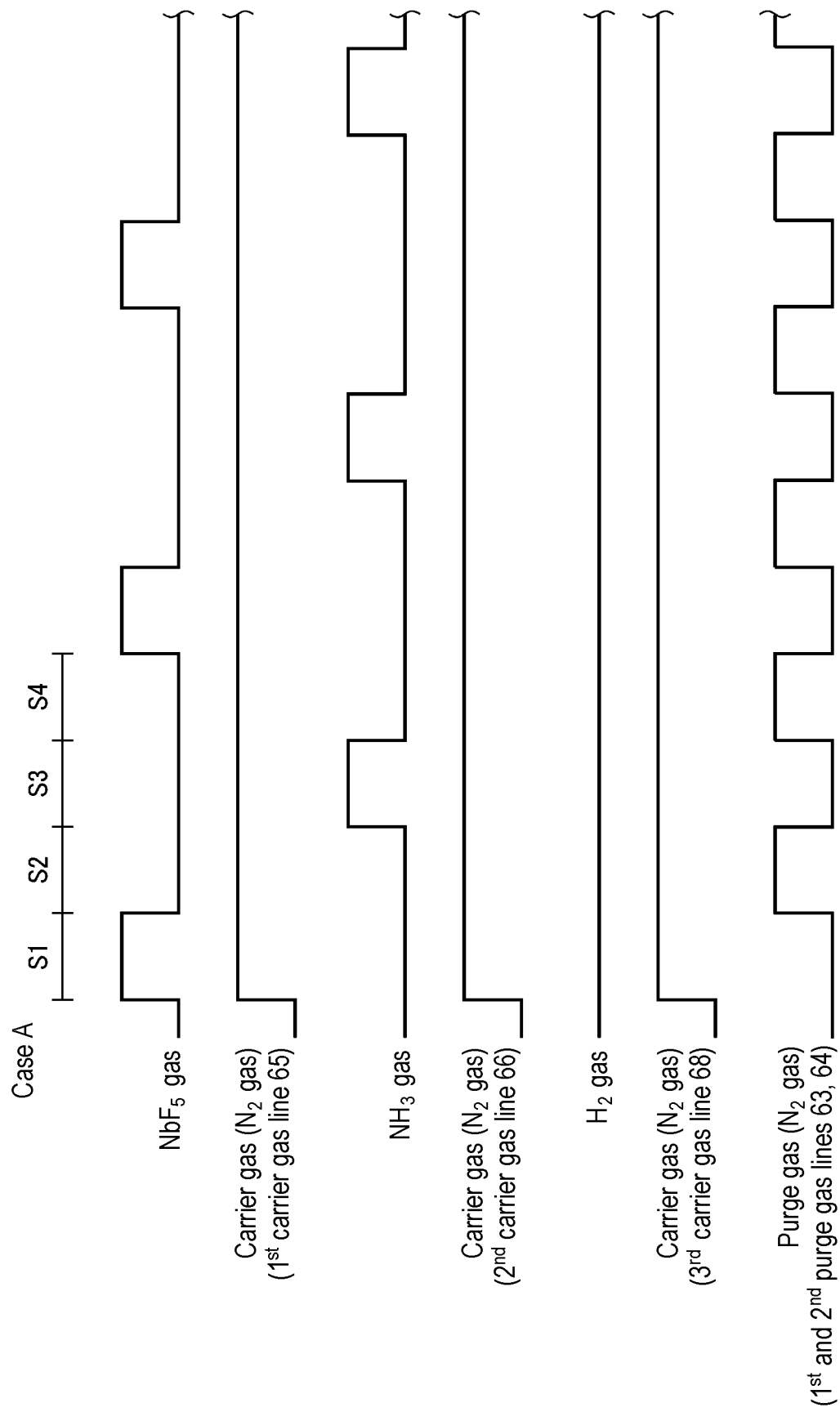
FIG. 5 is a timing chart illustrating a gas supply sequence of Case A.

In Case A, the film forming process is implemented in the sequence illustrated in the timing chart of FIG. 5 in the state in which $N_2$ gas as a carrier gas, which also functions as a purge gas, continuously flows by opening the valves V5, V6, and V8. In the initial state, the valves V1, V2a, V2b, V3, and V4 are closed. From this state, first, the valve V1 is opened to supply $NbF_5$ gas to the processing space S (operation Si). As a result, the $NbF_5$ gas is adsorbed on the surface of the wafer W. Next, the opening/closing valve 71 is closed so that only $N_2$ gas is supplied to the processing space S, and purging is performed to remove the residual gas on the wafer W (operation S2). At this time, as illustrated in the figure, the purge gas may be supplied from the first purge gas line 63 and the second purge gas line 64 by opening the valves V3 and V4. The same also applies to other purging. Next, $NH_3$ gas as a nitrogen-containing gas, which is a reducing gas, is supplied to the processing space S by opening the valves V2a and V2b (operation S3). As a result, the $NbF_5$ gas adsorbed on the surface of the wafer W reacts with the $NH_3$ gas to form a thin unit NbN film. Next, the valves V2a and V2b are closed so that only the $N_2$ gas is supplied to the processing space S, and purging is performed to remove the residual gas on the wafer W (operation S4). The above operations S1 to S4 are repeated in a predetermined number of cycle. As a result, an NbN film having a desired film thickness is formed The substrate temperature (film formation temperature) at this time may be in the range of 200 to 700 degrees C. When the temperature is lower than 200 degrees, the film formation reaction is unlikely to occur, and when the temperature exceeds 700 degrees C., the grain size becomes large and the film quality is deteriorated. More preferably, the temperature is in the range of 400 to 600 degrees C. The pressure in the chamber 1 may be in the range of 40 to 13,332 Pa (0.3 to 100 Torr).

When the volume of the chamber (the volume of the processing space) in the film forming apparatus illustrated in FIG. 4 is 0.65 to 1.70 L, gas flow rates and time periods may be set to the following conditions.

Flow rate of purge $N_2$ gas (total amount): 1,000 to 15,000 sccm

Flow rate of carrier $N_2$ gas for $NbF_5$ gas: 300 to 3,000 sccm (1 to 100 sccm in terms of $NbF_5$ gas)

Flow rate of $NH_3$ gas: 100 to 9,000 sccm

Time of S1: 0.05 to 5 sec

Time of S2: 0.05 to 5 sec

Time of S3: 0.05 to 10 sec

Time of S4: 0.05 to 5 sec

In the conditions of operations S1 to S4, the film formation rate per cycle (cycle rate) is preferably about 0.1 to 1.0 nm/cycle from the viewpoint of suppressing the CVD reaction as much as possible and performing ALD film formation with good controllability.

2. Case B

Figure 6:
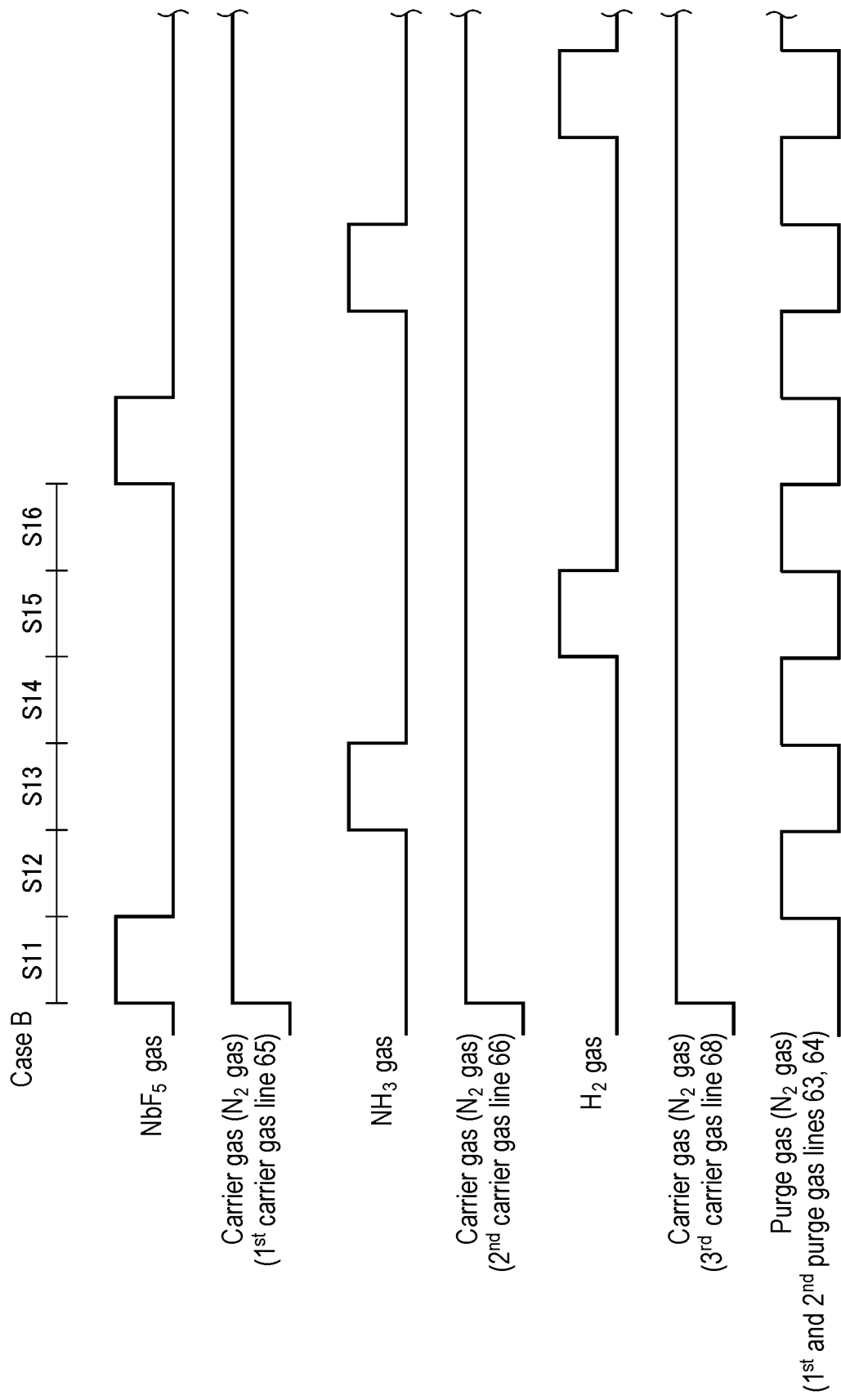
FIG. 6 is a timing chart illustrating a gas supply sequence of Case B.

In Case B, the film forming process is implemented in the sequence illustrated in the timing chart of FIG. 6 in the state in which $N_2$ gas as a carrier gas, which also functions as a purge gas, continuously flows by opening the valves V5, V6, and V8. In the initial state, the valves V1, V2a, V2b, V3, and V4 are closed. From this state, first, the valve V1 is opened to supply $NbF_5$ gas to the processing space S (operation S11). As a result, the $NbF_5$ gas is adsorbed on the surface of the wafer W. Next, the opening/closing valve 71 is closed so that only $N_2$ gas is supplied to the processing space S, and purging is performed to remove the residual gas on the wafer W (operation S12). At this time, as illustrated in the figure, the purge gas may be supplied from the first purge gas line 63 and the second purge gas line 64 by opening the valves V3 and V4. The same also applies to other purging. Next, $NH_3$ gas as a nitrogen-containing gas, which is a reducing gas, is supplied to the processing space S by opening the valves V2a and V2b (operation S13). As a result, the $NbF_5$ gas adsorbed on the surface of the wafer W reacts with the $NH_3$ gas to form a thin unit NbN film. Next, the valves V2a and V2b are closed so that only the $N_2$ gas is supplied to the processing space S, and purging is performed to remove the residual gas on the wafer W (operation S14). Next, $H_2$ gas as a reducing gas is supplied to the processing space S by opening the valve V7 (operation S15). By supplying the $H_2$ gas, it is possible to cause the reducing reaction to further progress after nitriding with the $NH_3$ gas. Next, the valve V7 is closed so that only the $N_2$ gas is supplied to the processing space S, and purging is performed to remove the residual gas on the wafer W (operation S16). The above operations S11 to S16 are repeated in a predetermined number of cycle. As a result, an NbN film having a desired film thickness is formed The temperature of the substrate and the pressure in the chamber 1 at this time may be the same ranges as Case A. In addition, when the volume of the chamber (the volume of the processing space) is 0.65 to 1.70 L, the flow rates of gases and times when performing S11 to S14 may be the same as those in S1 to S4 in Case A. The conditions of S15 may be as follows: flow rate of $H_2$ gas: 100 to 9,000 sccm and time: 0.05 to 10 sec. The conditions of S16 may be as follows: flow rate of $N_2$ gas (total amount): 1,000 to 15,000 sccm (similar to case A) and time: 0.05 to 5 sec.

3. Case C

Figure 7:
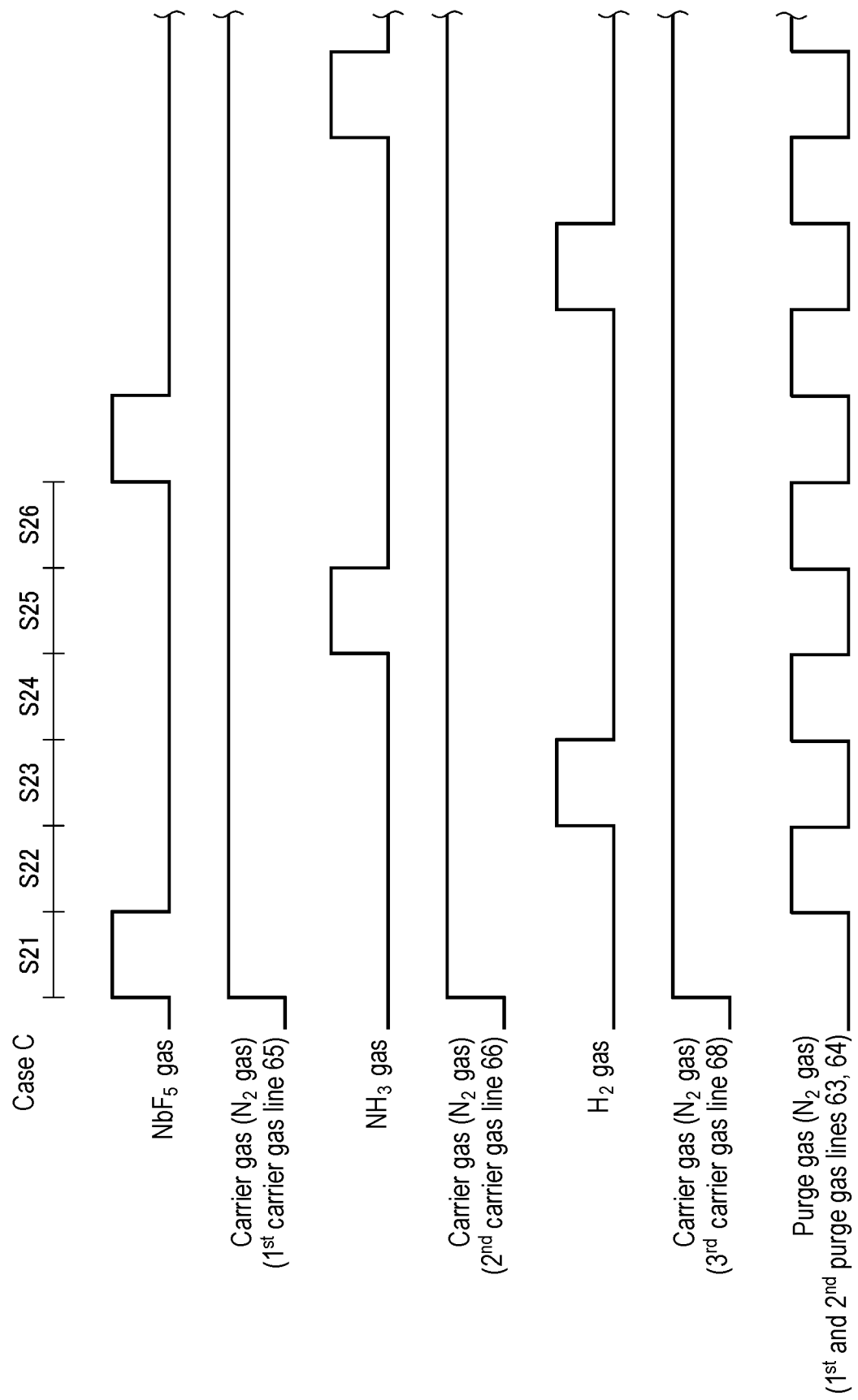
FIG. 7 is a timing chart illustrating a gas supply sequence of Case C.

In Case C, the film forming process is implemented in the sequence illustrated in the timing chart of FIG. 7 in the state in which $N_2$ gas as a carrier gas, which also functions as a purge gas, continuously flows by opening the valves V5, V6, and V8. In the initial state, the valves V1, V2a, V2b, V3, and V4 are closed. From this state, first, the valve V1 is opened to supply $NbF_5$ gas to the processing space S (operation S21). As a result, the $NbF_5$ gas is adsorbed on the surface of the wafer W. Next, the opening/closing valve 71 is closed so that only $N_2$ gas is supplied to the processing space S, and purging is performed to remove the residual gas on the wafer W (operation S22). At this time, as illustrated in the figure, the purge gas may be supplied from the first purge gas line 63 and the second purge gas line 64 by opening the valves V3 and V4. The same also applies to other purging. Next, $H_2$ gas as a reducing gas is supplied to the processing space S by opening the valve V7 (operation S23). As a result, the adsorbed $NbF_5$ gas is partially reduced. Next, the valve V7 is closed so that only the $N_2$ gas is supplied to the processing space S, and purging is performed to remove the residual gas on the wafer W (operation S24). Next, $NH_3$ gas as a nitrogen-containing gas, which is a reducing gas, is supplied to the processing space S by opening the valves V2a and V2b (operation S25). As a result, the $NbF_5$ gas existing on the surface of the wafer W reacts with the $NH_3$ gas to form a thin unit NbN film. Next, the valves V2a and V2b are closed so that only the $N_2$ gas is supplied to the processing space S, and purging is performed to remove the residual gas on the wafer W (operation S26). The above operations S21 to S26 are repeated in a predetermined number of cycles. As a result, an NbN film having a desired film thickness is formed The temperature of the substrate and the pressure in the chamber 1 at this time may be the same ranges as Case A. In addition, when the volume of the chamber (the volume of the processing space) is 0.65 to 1.70 L, the flow rates of gases and times when performing S21, S22, S25, and S26 may be the same as those in S1 to S4 in Case A. The conditions of S23 and S24 are the same as those of S15 and S16 of Case B.

With Cases A to C, it is possible to form a NbN film having good film quality with high step coverage. In particular, by using a substrate on which a metal-based film, such as a TiN film or SiN film, is formed on the surface, nucleation of NbN is promoted so that the film quality and step coverage can be further improved. At this time, the thickness of the metal-based film, for example, the TiN film, may be 10 nm or less, and the effect can be obtained even at about 0.3 nm. When the NbN film is formed directly on a $SiO_2$ film in which recesses such as holes and trenches are formed, nucleation may be insufficient and the NbN film may be formed in an island shape. In addition, even when the NbN film is formed directly on silicon, the surface morphology may not be sufficient.

In Case A in which only $NH_3$ gas is used as a reducing gas, it is possible to obtain good film quality and step coverage. In Cases B and C in which $H_2$ gas is added as the reducing gas, reduction is promoted so that it is possible to obtain better film quality and step coverage. Comparing Case B and Case C, in Case B in which the $NH_3$ gas is supplied after the $NbF_5$ gas is adsorbed, it is possible to obtain better film quality and step coverage since nitriding surely progresses and then reduction further progresses by the $H_2$ gas.

Unlike Case B and Case C, it is not necessary to supply the $H_2$ gas every time the $NH_3$ gas is supplied, and the $H_2$ gas may be supplied once after supplying the $NH_3$ gas several times. In addition, the $H_2$ gas may be constantly supplied together with the $N_2$ gas by connecting the $H_2$ gas supply pipe to the $N_2$ gas supply pipe. Furthermore, the $H_2$ gas may be supplied by post-flow separately from the reducing gas, which is alternately supplied with the $NbF_5$ gas. The post-flow may be performed only at the end of the film forming process, or may be performed every one or several cycles of the ALD.

<Specific Example of Semiconductor Device Manufacturing Method>

Next, a specific example of a semiconductor device manufacturing method when the above-described NbN film is applied will be described. In this example, a TiN film is formed as a metal-based film on a wafer W, and an NbN film is formed on the TiN film.

[Film Forming System]

Figure 8:
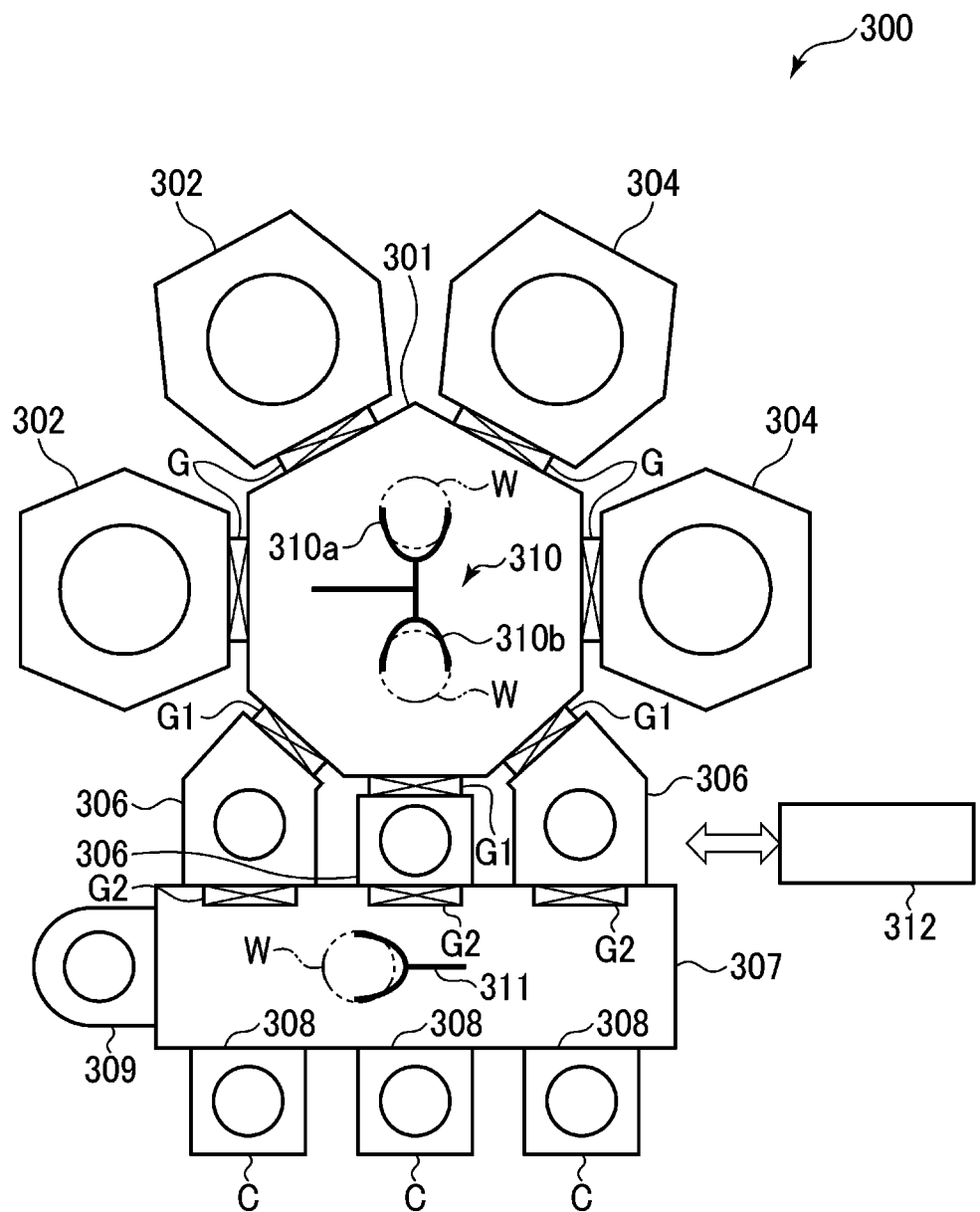
FIG. 8 is a horizontal cross-sectional view schematically illustrating an example of a film forming system used in a specific example of a semiconductor device manufacturing method.

FIG. 8 is a horizontal cross-sectional view schematically illustrating an example of the film forming system used in this specific example.

As illustrated in FIG. 8, the film forming system 300 of this example includes a vacuum transfer chamber 301 having a heptagonal shape in a plan view, and two TiN film forming apparatuses 302 and two NbN film forming apparatuses 304 are connected to four walls of the vacuum transfer chamber 301 via gate valves G, respectively.

The NbN film forming apparatuses 304 are configured in the same manner as the film forming apparatus 100 described above, and are configured to form an NbN film through an ALD method. In addition, the TiN film forming apparatuses 302 form a TiN film through an ALD method using $TiCl_4$ gas as a Ti raw material gas and using $NH_3$ gas as a reducing gas (a nitriding gas), and are configured in the same manner as the NbN film forming apparatuses 304, except that gas systems thereof are different from each other.

In addition, three load-lock chambers 306 are connected to the other three walls of the vacuum transfer chamber 301 via gate valves G1, respectively. An atmospheric transfer chamber 307 is installed on the side opposite to the vacuum transfer chamber 301, with the load-lock chambers 306 interposed therebetween. The three load-lock chambers 306 are connected to the atmospheric transfer chamber 307 via the gate valves G2, respectively. The load-lock chambers 306 perform pressure control between the atmospheric pressure and the vacuum when wafers W is transferred between the atmospheric transfer chamber 307 and the vacuum transfer chamber 301.

The wall of the atmospheric transfer chamber 307 opposite to the wall, on which the load-lock chambers 306 are mounted, includes three carrier mounting ports 308 in each of which a carrier C, such as a FOUP configured to accommodate therein a wafer W. In addition, on a side wall of the atmospheric transfer chamber 307, an alignment chamber 309 is provided to perform alignment of a wafer W. The atmospheric transfer chamber 307 is configured to form a downflow of clean air therein.

In the vacuum transfer chamber 301, a first transfer mechanism 310 is provided. The first wafer transfer mechanism 310 transfers wafers W with respect to the two TiN film forming apparatuses 302 and NbN film forming apparatuses 304. The first wafer transfer mechanism 310 has two transfer arms 310a and 310b, which are independently movable.

In the atmospheric transfer chamber 307, a second wafer transfer mechanism 311 is installed. The second wafer transfer mechanism 311 transfers wafers W with respect to the carriers C, the load-lock chambers 306, and the alignment chamber 309.

The film forming system 300 has an overall controller 312. The overall controller 312 controls the TiN film forming apparatuses 302, the NbN film forming apparatuses 304, the exhaust mechanism and the first wafer transfer mechanism 310 of the vacuum transfer chamber 301, the second wafer transfer mechanism 311, the exhaust mechanism and the gas supply mechanism of the load-lock chambers 306, the driving system of the gate valves G, G1, and G2, and the like. The overall controller 312 includes a main controller having a CPU (computer), an input device, an output device, a display device, and a storage device. The main controller of the overall controller 312 causes the film forming system 300 to execute a predetermined operation on the basis of, for example, a processing recipe stored in a storage medium embedded in the storage device or a storage medium set in the storage device.

[Semiconductor Device Manufacturing Method]

Next, a specific example of a semiconductor device manufacturing method using the above-described film forming system 300 will be described.

In the film forming system 300, for example, carriers C, each accommodating a predetermined number of wafers W having the same structure as the wafer 201 illustrated in FIG. 3A described above, are connected to the carrier mounting ports 308 of the atmospheric transfer chamber 307. Then, first, a wafer W is taken out from a carrier C by the second wafer transfer mechanism 311, the gate valve G2 of any of the load-lock chambers 306 is opened, and the wafer W is loaded into the load-lock chamber 306 via the alignment chamber 309. After closing the gate valve G2, the interior of the load-lock chamber 306 is evacuated.

When the load-lock chamber 306 reaches a predetermined degree of vacuum, the gate valve G1 is opened and the wafer W is taken out from the load-lock chamber 306 by the first wafer transfer mechanism 310. Then, the gate valve G of any of the TiN film forming apparatuses 302 is opened, and the wafer W held by the first wafer transfer mechanism 310 is loaded into the chamber of the TiN film forming apparatus 302. Then, A TiN film is formed through ALD by supplying $TiCl_4$ gas as a Ti raw material gas and $NH_3$ gas as a nitriding gas into the chamber.

After the TiN film is formed, the wafer W in the TiN film forming apparatus 302 is taken out by the first wafer transfer mechanism 310. Then, the gate valve G of any of the NbN film forming apparatuses 304 is opened, the wafer W held by the first wafer transfer mechanism 310 is loaded into the chamber of the NbN film forming apparatus 304, and a NbN film is formed. The film formation at this time is performed in the same manner as the film formation by the film forming apparatus 100 described above.

After forming the NbN film, the wafer W is taken out by the first wafer transfer mechanism 310, the gate valve G1 is opened, the wafer W is transferred from the first wafer transfer mechanism 310 to the load-lock chamber 306, the gate valve G1 is closed, and the interior of the load lock chamber 306 is returned to the atmospheric pressure. Thereafter, the gate valve G2 is opened, and the wafer W in the load-lock chamber 306 is returned to the carrier C by the second wafer transfer mechanism 311.

The processes described above are performed simultaneously for wafers W, and a series of processes is completed for the number of wafers W mounted in the carriers C.

In this way, after forming a TiN film on a wafer W, a NbN film can be formed in-situ on the TiN film through an ALD method without breaking the vacuum. Thus, it is possible to form the NbN film having good film quality with high step coverage. For example, since an NbN film having low resistivity is obtained with high step coverage, the NbN film is suitable as an electrode applied to a DRAM capacitor or the like. In this example, an example of a film forming system including a vacuum transfer chamber 301 having a heptagonal shape in a plan view is illustrated, but the present disclosure is not limited thereto. The vacuum transfer chamber 301 may have a polygonal shape or a shape in which polygonal shapes are combined such that film forming apparatuses are capable of continuously performing processes in-situ.

In addition, after forming the TiN film, the wafer may be unloaded to the atmosphere, and then the NbN film may be formed in ex-situ. In addition, the film forming apparatus of FIG. 4 may be provided with a gas line for $TiCl_4$ gas, and the Ti film and the NbN film may be continuously formed in the same chamber.

EXPERIMENTAL EXAMPLE

Subsequently, experimental examples will be described.

Experimental Example 1

Here, the influence of a base was confirmed when a NbN film was formed as a group V metal nitride film on a wafer through an ALD method in which the temperature of the wafer was set to 530 degrees C., $NbF_5$ gas was used as a raw material gas including a group V metal, and $NH_3$ gas was used as a nitrogen-containing gas, which is a reducing agent.

First, regarding a case in which a NbN film was formed directly on a substrate obtained by forming a $SiO_2$ film on a silicon base body with a thickness of 100 nm (Sample A) and a case in which a TiN film was formed on the $SiO_2$ film with a thickness of 10 nm and then a NbN film was formed thereon (Sample B), the states of the films were confirmed. The TiN film was formed through ALD in which $TiCl_4$ gas and $NH_3$ gas were alternately supplied to form a film.

Figure 9:
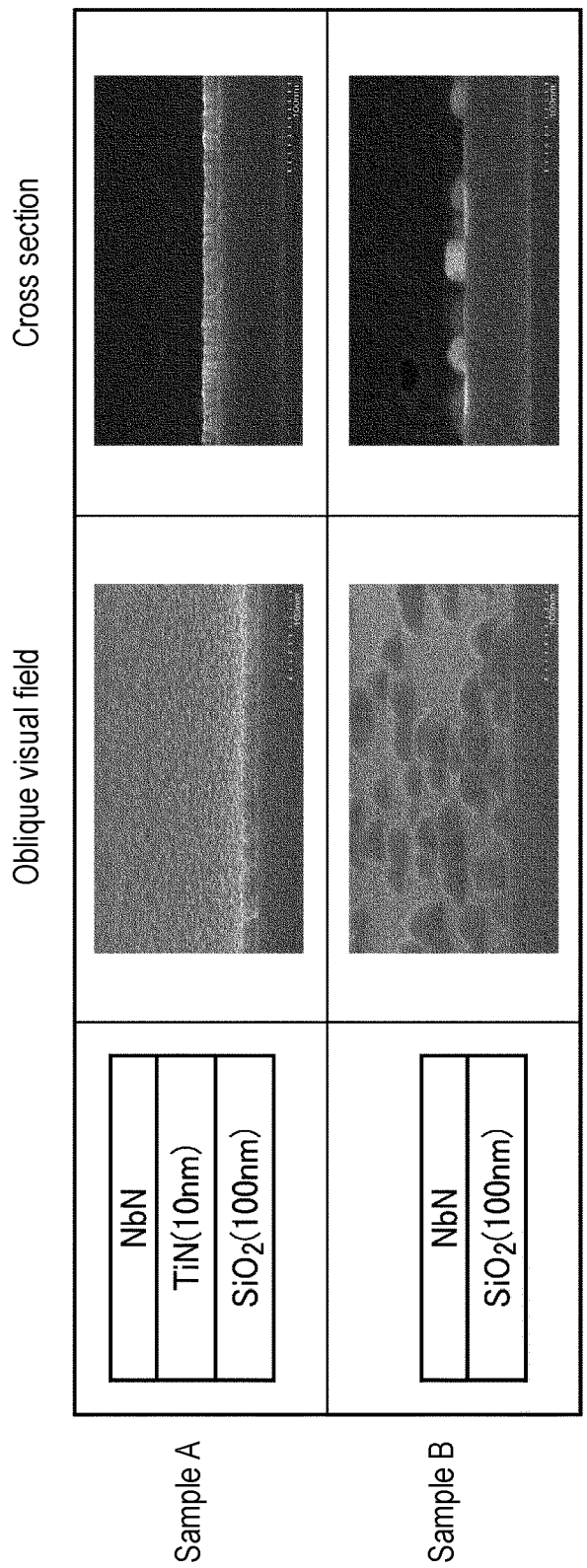
FIG. 9 shows SEM photographs of Sample A and Sample B in Experimental Example 1.

The film formation conditions for the NbN films at this time were as follows.
Temperature of substrate: 530 degrees C.
Pressure: 3 Torr (400 Pa)
Sequence: $NbF_5$/purging/$NH_3$/purging
Flow rate of gas: $NbF_5$ carrier $N_2$=300 sccm
  $NH_3$=9,000 sccm
  Purge $N_2$ gas=2 slm each (6 slm in total)
Number of cycles: 100 cycles FIG. 9 shows SEM photographs of oblique visual fields and cross sections of Sample A and Sample B. As shown in these SEM photographs, NbN nucleation tended not to progress sufficiently, on the $SiO_2$ film, and thus the NbN film was form in island shapes. However, on the TiN film, the NbN film with good surface morphology was obtained. The NbN film also had a uniform film thickness of about 13 nm.

Figure 10:
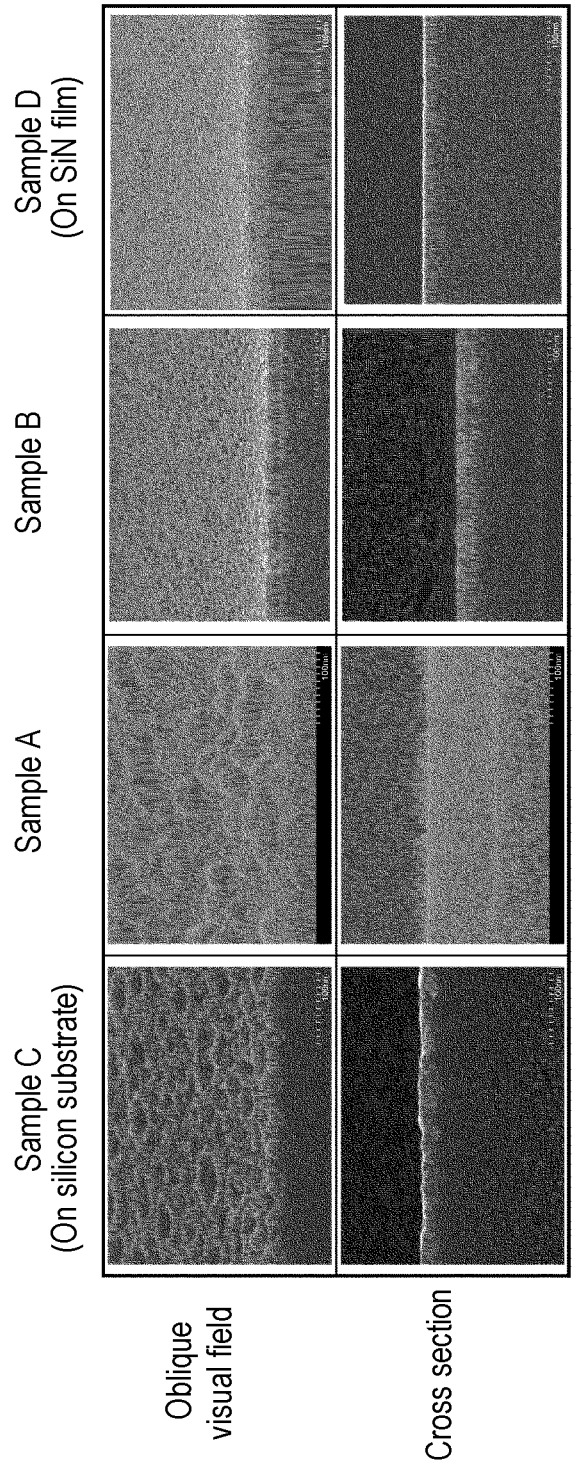
FIG. 10 shows SEM photographs of Samples A to D in Experimental Example 1.

Next, under the same conditions, regarding a case in which the NbN film was directly formed on a silicon base body (Sample C) and a case in which a SiN film was formed instead of the TiN film and then the NbN film was formed (Sample D), the states of the films were also confirmed. FIG. 10 shows SEM photographs of oblique visual fields and cross sections of Sample C and Sample D in comparison with Sample A and Sample B described above. As shown in these SEM photographs, in the film formation on the silicon base body of Sample C, nucleation of NbN progressed more than on the $SiO_2$ film, but the surface morphology of the NbN film was poor. In the film formation on the SiN film of Sample D, good surface morphology close to that of the NbN film on the TiN film was obtained.

Experimental Example 2

Here, regarding Sample E in which a NbN film was formed under the above-described conditions on a substrate obtained by forming a $SiO_2$ film on a silicon base body and then forming a TiN film with a 10 nm thickness through ALD (which is the same as Sample B), the sheet resistance was measured and the film composition of the NbN film was further analyzed using XPS. The sheet resistance was also measured on the substrate before the NbN film was formed.

Figure 11:
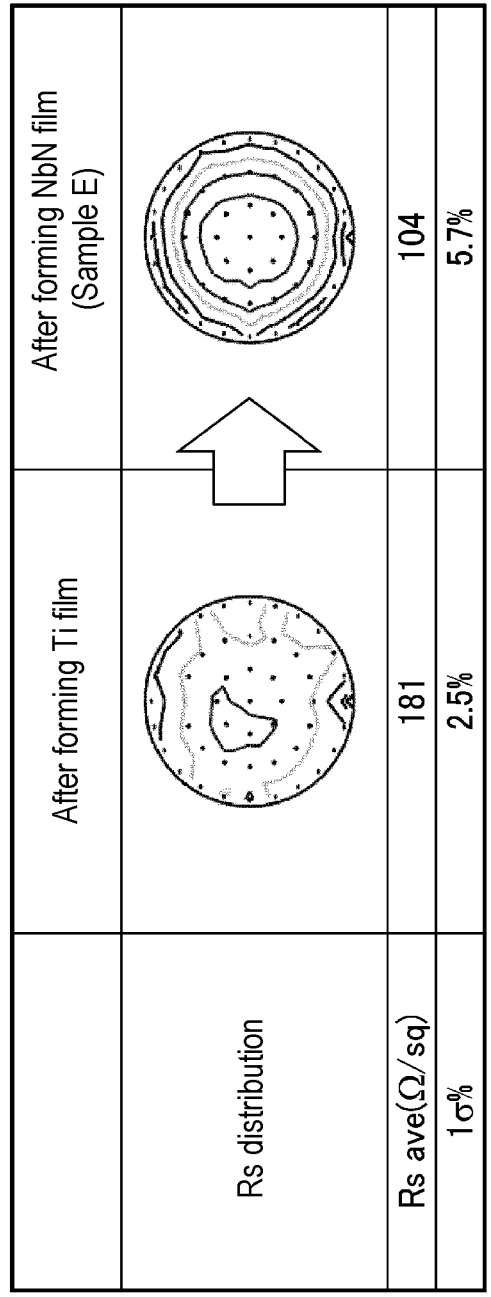
FIG. 11 is a view showing results of sheet resistance before forming a NbN film, sheet resistance of Sample E after forming a NbN film, and composition analysis results of a NbN film in Experimental Example 2.

FIG. 11 shows the results. Regarding the sheet resistance, a low value was maintained even after the NbN film was formed, and the value of 1σ was also low. Regarding the film composition, in addition to O of the oxide mainly formed on the surface, C from an analyzer, Ti from the base, and F derived from the $NbF_5$, it was confirmed that the NbN film was obtained with Nb and N.

Experimental Example 3

Here, three types of substrates obtained by forming $SiO_2$ films on respective silicon base bodies and then forming TiN films with thicknesses of 10 nm, 1 nm, and 0.3 nm on the respective $SiO_2$ films through ALD were prepared, and three samples (Sample F to H) were manufactured by forming NbN films on the respective substrates under the above-described conditions.

FIG. 12 shows Rs distributions, cross-sectional SEM photographs, Rs values, SEM film thicknesses of NbN films, and resistivities of these samples. As shown in FIG. 12, NbN films having uniform and good surface morphology were obtained regardless of the thicknesses of the TiN films. From this, it was confirmed that a NbN film can be satisfactorily formed even when the TiN film is about 0.3 nm. It was confirmed that, when the TiN film becomes thinner, the sheet resistance and the resistivity tend to increase and the non-uniformity of the sheet resistance also tends to increase.

Experimental Example 4

Here, three types of samples (Samples I to K) were manufactured by forming NbN films on respective substrates, each of which was obtained by forming an TiN film with a 10 nm thickness using different gas supply sequences, respectively, after forming a $SiO_2$ film on a silicon base body. The conditions for Sample I were the same as those for forming the NbN films of Sample A and Sample B described above. For Sample J and Sample K, $H_2$ gas was used as a reducing gas in addition to $NH_3$ gas. In Sample J, the gas supply sequence was $NbF_5$/purging/$H_2$/purging/$NH_3$/purging, and in Sample K, the gas supply sequence was $NbF_5$/purging/$NH_3$/purging/$H_2$/purging. In addition, each of the $H_2$ flow rates was set to 9,000 sccm. Other conditions were the same as when the NbN films of Sample A and Sample B were formed.

FIG. 13 shows SEM photographs of oblique visual fields and cross sections of these samples, SEM film thicknesses of NbN films, and resistivities. As shown in FIG. 13, it was confirmed that a NbN film with uniform and good surface morphology was formed in each sample. Regarding the resistivities, there was a tendency that the resistivities of Sample J and Sample K obtained using $NH_3$ gas and $H_2$ gas as reducing gases were lower than that of Sample I obtained using only $NH_3$ gas as a reducing gas. Comparing Sample J and Sample K, Sample K obtained using the sequence of supplying $NH_3$ gas after adsorption of $NbF_5$ gas showed a lower resistivity because the $H_2$ gas was supplied after nitriding surely progressed.

Experimental Example 5

Here, wafers were manufactured by forming multilayer films, such as $SiO_2$ films, on respective silicon base bodies, and forming holes having a diameter of 50 nm and a depth of 1.4 μm in each multilayer film. After forming a TiN film on each of these wafers through ALD in which $TiCl_4$ gas and $NH_3$ gas were repeatedly supplied in 40 cycles, Samples L to O in which NbN films are formed in-situ under various conditions were manufactured and step coverage was determined.

In Sample L, the NbN film was formed using $NbF_5$ gas and $NH_3$ gas under the above-described conditions (e.g., temperature of wafer: 530 degrees C., pressure: 3 Torr (400 Pa), flow rate of carrier $N_2$ gas: 300 sccm) (target film thickness: 15 nm). In Sample M, the NbN film was formed under the same conditions as Sample L, except that the flow rate of carrier $N_2$ gas was increased to 3,000 sccm. In the sample N, the NbN film was formed by setting the gas supply sequence as $NbF_5$/purging/$H_2$/purging/$NH_3$/purging, as in the case of Sample J described above. In sample O, the NbN film was formed by setting the gas supply sequence as $NbF_5$/purging/$NH_3$/purging/$H_2$/purging, as in the case of Sample K described above.

Figure 14:
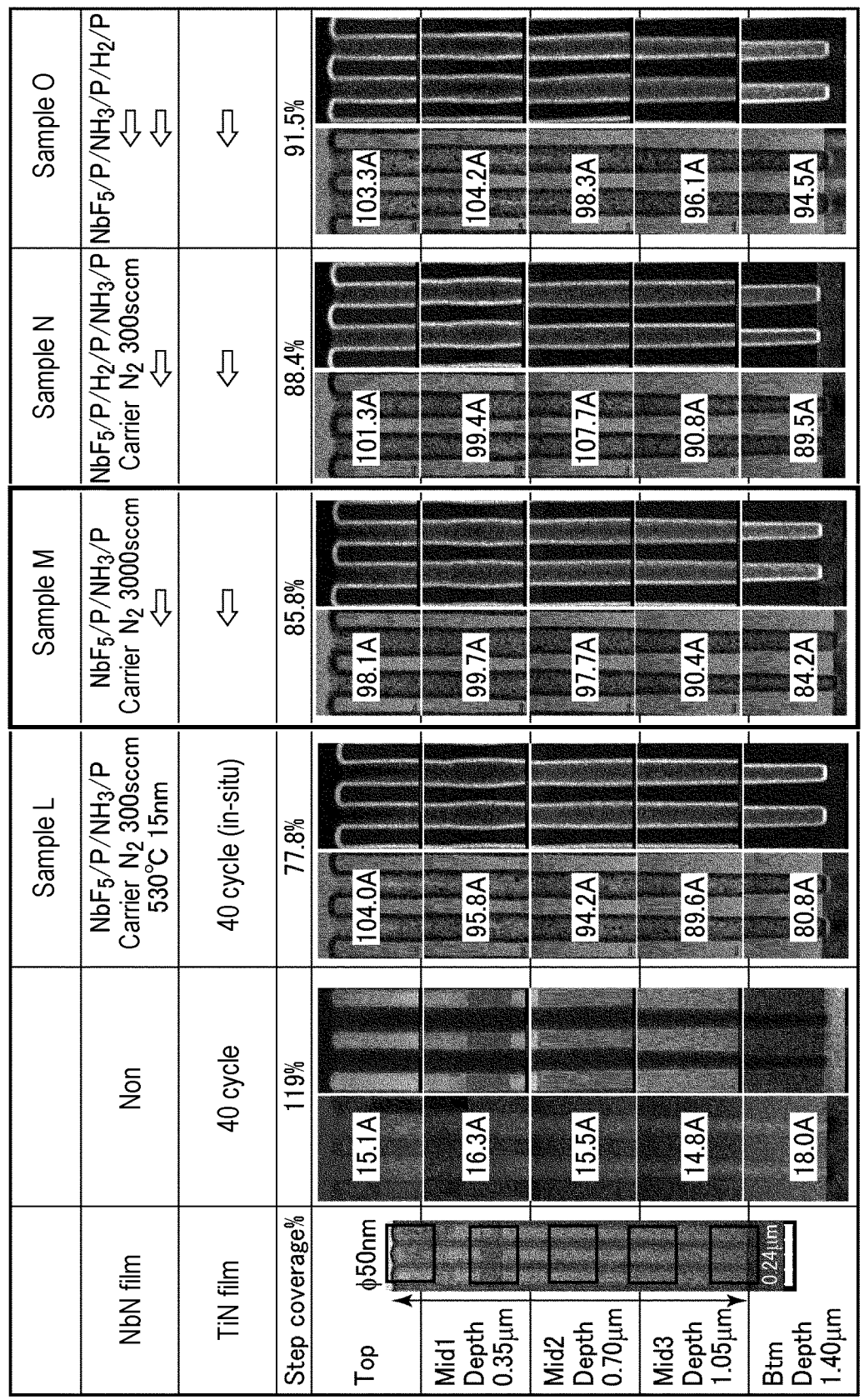
FIG. 14 is a view illustrating cross-sectional TEM photographs showing a state before forming an NbN film and Samples L to O in Experimental Example 5.

FIG. 14 shows cross-sectional TEM photographs showing the state after the TIN film was formed and before the NbN film was formed, and Samples L to O. In FIG. 14, the depth from top to a depth of 1.4 um is shown in five portions (Top, Mid1, Mid2, Mid3, and Btm), and the step coverage is shown by a film thickness ratio of Btm/Top. The left side of each TEM image is transmitted light, and the right side is scattered light. In addition, in the figure, the film thickness is indicated by angstrom (A). As shown in FIG. 14, the step coverage of the TiN film was 119%. The step coverage of the NbN film of Sample L was 77.8%. In Sample M, by increasing the flow rate of carrier $N_2$ gas, the supply of NbFs gas to the bottoms of the holes was promoted, and the step coverage was increased to 85.8%. The reduction of Sample N and Sample O was promoted by $H_2$ gas, and the step coverage was further improved. In particular, in Sample O, the highest step coverage of 91.5% was obtained by supplying $H_2$ gas after nitriding surely progressed by supplying $NH_3$ gas after $NbF_5$ gas was adsorbed.

Other Applications

Although embodiments have been described above, it should be considered that the embodiments disclosed herein are exemplary in all respect and are not restrictive. The embodiments described above may be omitted, replaced, or modified in various forms without departing from the scope and spirit of the appended claims.

For example, in the embodiments described above, a case in which $NbF_5$ gas is used as a raw material gas to form a NbN film has been mainly described, but the present disclosure is applicable to a case in which a group V metal nitride film is formed using a raw material gas including a group V metal and a reducing gas including a nitrogen-containing gas, as described above.

In addition, the film forming apparatus illustrated in FIG. 4 is merely an example, and a single wafer film forming apparatus having a structure different from that of FIG. 4 or a batch type film forming apparatus for forming a film on substrates at once may be applicable. Furthermore, a film forming apparatus that performs ALD through relative movement between a gas supply region and a substrate may be applicable. An example of such a film forming apparatus includes a semi-batch type apparatus in which substrates are placed on a rotatable stage and ALD film formation is performed on the substrates by causing the substrates to pass through respective gas supply regions while rotating the stage. In addition, the film forming apparatus may be a semi-batch type film forming apparatus in which substrates are placed on a non-rotating stage to perform ALD film formation.

Since the supply times and flow rates of the raw material gases, the nitriding gases, and the purge gases vary depending on the size of the chamber of the film forming apparatus and the like, the supply times and flow rates may be appropriately set depending on the size of the chamber.

Furthermore, in the embodiments described above, a semiconductor wafer has been described as an example of a substrate to be processed, but the substrate is not limited to the semiconductor wafer, and may be another substrate, such as a glass substrate used for a flat panel display (FPD) or a ceramic substrate.

EXPLANATION OF REFERENCE NUMERALS

1: chamber, 2: susceptor, 3: shower head; 4: exhauster, 5: gas supply mechanism, 6: controller, 51: $NbF_3$ gas source, 52: $NH_3$ gas source, 53: $H_2$ gas source, 54, 55, 56: $N_2$ gas source, 201: semiconductor wafer, 202: base body, 203: $SiO_2$ film, 204: recess, 205: metal-based film, 206: nitride film, S: processing space, W: semiconductor wafer (substrate)

What is claimed is:

1. A method of manufacturing a semiconductor device, the method comprising:
    forming a seed layer on a surface of a substrate; and
    forming a group V metal nitride film on the seed layer by alternately supplying a raw material gas including a group V metal and a reducing gas including a nitrogen-containing gas,
    wherein the seed layer is one of a titanium nitride film or a silicon nitride film.

2. The method of claim 1, wherein the titanium nitride film is formed on the substrate by alternately supplying a titanium-containing gas and the nitrogen-containing gas.

3. The method of claim 1, wherein the seed layer has a thickness of 10 nm or less.

4. The method of claim 1, wherein the raw material gas including the group V metal is a niobium fluoride, and the group V metal nitride film is a niobium nitride film.

5. The method of claim 1, wherein the forming the seed layer and the forming the group V metal nitride film are performed within separate processing containers, respectively.

6. The method of claim 1, wherein the forming the seed layer and the forming the group V metal nitride film are performed within a same processing container.

* * * * *